United States Patent
Yamaguchi et al.

(10) Patent No.: US 11,459,226 B2
(45) Date of Patent: Oct. 4, 2022

(54) SEMICONDUCTOR DEVICE AND SEMICONDUCTOR DEVICE MANUFACTURING METHOD

(71) Applicant: Mitsubishi Electric Corporation, Tokyo (JP)

(72) Inventors: Yasuo Yamaguchi, Tokyo (JP); Mika Okumura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 178 days.

(21) Appl. No.: 15/700,203

(22) Filed: Sep. 11, 2017

(65) Prior Publication Data

US 2018/0215606 A1 Aug. 2, 2018

(30) Foreign Application Priority Data

Jan. 27, 2017 (JP) .............................. JP2017-013399

(51) Int. Cl.
*G01P 15/125* (2006.01)
*B81B 3/00* (2006.01)
(Continued)

(52) U.S. Cl.
CPC ............ *B81B 3/0008* (2013.01); *B81B 3/001* (2013.01); *B81B 7/0041* (2013.01);
(Continued)

(58) Field of Classification Search
None
See application file for complete search history.

(56) References Cited

U.S. PATENT DOCUMENTS 5,350,189 A * 9/1994 Tsuchitani ............. G01P 1/003
180/282
5,417,312 A * 5/1995 Tsuchitani ............. G01P 1/003
188/181 A
(Continued)

FOREIGN PATENT DOCUMENTS

CN 105236345 A 1/2016
CN 106115615 A 11/2016
(Continued)

OTHER PUBLICATIONS

An Office Action mailed by the German Patent and Trademark Office dated Apr. 13, 2018, which corresponds to German Patent Application No. 10 2017 219 640.8 and is related to U.S. Appl. No. 15/700,203.

(Continued)

*Primary Examiner* — Jill E Culler
*Assistant Examiner* — Ruben C Parco, Jr.
(74) *Attorney, Agent, or Firm* — Studebaker & Brackett PC

(57) ABSTRACT

A semiconductor device includes a substrate, a movable portion provided on the substrate, a junction frame provided on the substrate to surround the movable portion, a cap bonded to the junction frame, the cap having a recessed portion and covering a space over the movable portion with the recessed portion facing the movable portion, the cap having an inside wall provided with irregularities, and a prevention film formed on the inside wall of the cap, the prevention film having irregularities on a surface thereof.

8 Claims, 4 Drawing Sheets

(51) Int. Cl.
*B81B 7/00* (2006.01)
*G01P 1/02* (2006.01)
*G01P 15/08* (2006.01)

(52) U.S. Cl.
CPC ............ *B81B 7/0077* (2013.01); *G01P 1/023* (2013.01); *G01P 15/0802* (2013.01); *G01P 15/0888* (2013.01); *G01P 15/125* (2013.01); *B81B 2201/0235* (2013.01)

(56) References Cited

U.S. PATENT DOCUMENTS

| | | | |
|---|---|---|---|
| 5,668,033 | A | 9/1997 | Ohara et al. |
| 6,230,564 | B1 | 5/2001 | Matsunaga et al. |
| 6,953,993 | B2 * | 10/2005 | Yamaguchi ............ G01P 15/125 257/704 |
| 7,180,019 | B1 * | 2/2007 | Chiou ................ G01P 15/0891 200/61.45 M |
| 2005/0044953 | A1 | 3/2005 | Yamaguchi et al. |
| 2005/0126290 | A1 | 6/2005 | Yamaguchi |
| 2007/0062285 | A1 | 3/2007 | Yamaguchi et al. |
| 2007/0232107 | A1 | 10/2007 | Sugiura et al. |
| 2008/0168838 | A1 * | 7/2008 | Martin ................ B81C 99/0045 73/514.32 |
| 2009/0053855 | A1 | 2/2009 | Summers |
| 2009/0179287 | A1 | 7/2009 | Inaba |
| 2013/0042684 | A1 * | 2/2013 | Yoda .................... G01P 15/125 73/514.01 |
| 2017/0081176 | A1 | 3/2017 | Ji et al. |
| 2017/0313573 | A1 * | 11/2017 | Montez .................. B81B 3/001 |

FOREIGN PATENT DOCUMENTS

| | | |
|---|---|---|
| DE | 19619921 A1 | 12/1996 |
| DE | 102004028927 A1 | 4/2005 |
| DE | 102004042784 A1 | 7/2005 |
| DE | 699 28 061 T2 | 4/2006 |
| DE | 102006025373 A1 | 3/2007 |
| DE | 10 2007 015 892 A1 | 10/2007 |
| JP | 2005-172690 A | 6/2005 |
| JP | 2006-133245 A | 5/2006 |
| JP | 2007-085747 A | 4/2007 |

OTHER PUBLICATIONS

An Office Action mailed by the German Patent Office dated May 27, 2020, which corresponds to German Patent Application No. 102017219640.8 and is related to U.S. Appl. No. 15/700,203; with English language translation.

An Office Action mailed by the Japanese Patent Office dated Mar. 17, 2020, which corresponds to Japanese Patent Application No. 2017-013399 and is related to U.S. Appl. No. 15/700,203.

An Office Action issued by the China National Intellectual Property Administration dated Aug. 21, 2020, which corresponds to Chinese Patent Application No. 201810078133.9 and is related to U.S. Appl. No. 15/700,203 with English language translation.

An Office Action issued by the German Patent and Trademark Office dated Nov. 16, 2020, which corresponds to German Patent Application No. 10 2017 219 640.8 and is related to U.S. Appl. No. 15/700,203 ; with English language translation.

An Office Action mailed by China National Intellectual Property Adminisliation dated Feb. 19, 2021, which corresponds to Chinese Patent Application No. 201810078133.9 and is related to U.S. Appl. No. 15/700,203 with English language translation.

* cited by examiner

SEMICONDUCTOR DEVICE AND SEMICONDUCTOR DEVICE MANUFACTURING METHOD

BACKGROUND

Field

The present invention relates to a semiconductor device such as a sensor and a method for manufacturing the semiconductor device.

Background Art

Japanese Patent Application Publication No. 2007-085747 discloses a technique in which a cap is bonded to a junction frame provided on a semiconductor substrate with a recess of the cap facing the semiconductor substrate to provide an enclosed space. The enclosed space contains a movable portion. Further, a ductile, conductive shield film is provided on the entire inside surface of the cap.

Inside the enclosed space provided by the semiconductor substrate and the cap, the movable portion is provided. The movable portion is, for example, a part of an acceleration sensor or an angular velocity sensor. Electrical characteristics and vibration characteristics of the movable portion change according to the pressure in the enclosed space. Accordingly, to accurately detect a physical quantity to be detected, the pressure in the enclosed space needs to be kept at a predetermined pressure. To keep the enclosed space at an appropriate pressure, inert gas such as argon or nitrogen is used as sealing gas, or a vacuum is created in the enclosed space.

However, there are cases where the pressure in the enclosed space cannot be kept at the predetermined pressure due to gas emission from the cap and gas absorption by the cap. For example, in the case where the cap is bonded to the substrate by anodic bonding in which bonding is performed in a high-temperature, high-voltage environment, oxygen is emitted from the cap, and nitrogen is absorbed by the cap.

With the ductile, conductive shield film provided on the entire inside surface of the cap, the capacitive acceleration sensor disclosed in Japanese Patent Application Publication No. 2007-085747 can keep the pressure in the enclosed space at a predetermined pressure. However, the inside wall of the cap in Japanese Patent Application Publication No. 2007-085747 is formed by a planar surface. In the case where the inside wall of the cap is planar, the movable portion provided in the enclosed space tends to stick to the inside wall of the cap. In particular, there has been a problem that the movable portion sticks to the inside wall of the cap due to electrostatic forces acting when a junction frame and the cap are anodically bonded or external forces or electrostatic forces acting after the completion of the semiconductor device.

SUMMARY

The present invention has been accomplished to solve the above-described problems, and an object of the present invention is to provide a semiconductor device which can keep the pressure in an enclosed space for housing a movable portion at a predetermined pressure and can prevent the movable portion from sticking to an inside wall of a cap and a method for manufacturing the semiconductor device.

The features and advantages of the present invention may be summarized as follows.

According to one aspect of the present invention, a semiconductor device includes a substrate, a movable portion provided on the substrate, a junction frame provided on the substrate to surround the movable portion, a cap bonded to the junction frame, the cap having a recessed portion and covering a space over the movable portion with the recessed portion facing the movable portion, the cap having an inside wall provided with irregularities, and a prevention film formed on the inside wall of the cap, the prevention film having irregularities on a surface thereof.

According to another aspect of the present invention, a semiconductor device manufacturing method includes the steps of forming a device structure on a substrate, the device structure including a movable portion, a fixed portion, and a junction frame surrounding the movable portion and the fixed portion, forming a prevention film having irregularities on a surface thereof in a recessed portion of a cap, and anodically bonding the cap and the junction frame such that the recessed portion and the prevention film face the movable portion.

According to another aspect of the present invention, a semiconductor device manufacturing method includes the steps of forming a device structure on a substrate, the device structure including a movable portion, a fixed portion, and a junction frame surrounding the movable portion and the fixed portion, forming a recessed portion in a cap by sandblasting and then performing wet etching on the recessed portion, thus forming a recessed portion having a depth of 10 µm or more, and anodically bonding the cap and the junction frame such that the recessed portion faces the movable portion.

According to another aspect of the present invention, a semiconductor device manufacturing method includes the steps of forming a device structure on a substrate, the device structure including a movable portion, a fixed portion, and a junction frame surrounding the movable portion and the fixed portion, forming a cap having a recessed portion, heating the cap, and anodically bonding the cap and the junction frame such that the recessed portion faces the movable portion, in the same atmosphere and at the same temperature as when heating the cap.

Other and further objects, features and advantages of the invention will appear more fully from the following description.

DETAILED DESCRIPTION

Semiconductor devices and semiconductor device manufacturing methods according to embodiments of the present invention will be described with reference to the drawings.

Embodiment 1

Figure 1:
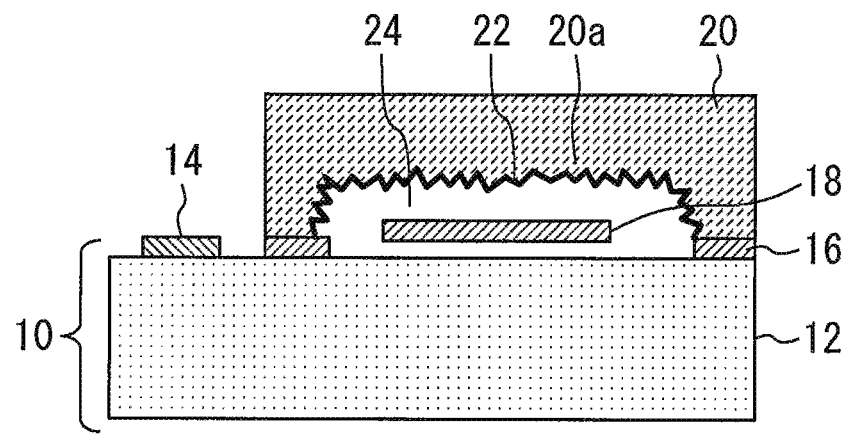
FIG. 1 is a cross-sectional view of a semiconductor device according to Embodiment 1.

FIG. 1 is a cross-sectional view of a semiconductor device according to Embodiment 1. This semiconductor device includes a device structure 10 functioning as an acceleration sensor. The device structure 10 is formed by, for example, repeating the deposition and etching of insulating films and metals on a surface of a substrate 12 made of a semiconductor. The insulating film may be, for example, polysilicon, an oxide film, or a nitride film. The device structure 10 includes electrodes 14, a junction frame 16, and a movable portion 18 formed on the substrate 12.

The electrodes 14 are made of metal. The junction frame 16 is formed by, for example, depositing doped polysilicon on an insulating film. The movable portion 18 is made of, for example, doped polysilicon. A cap 20 is bonded to the junction frame 16. The cap 20 is made of, for example, glass. Since the cap 20 has a recessed portion 20a, an enclosed space 24 is formed between the cap 20 and the substrate 12.

Figure 2:
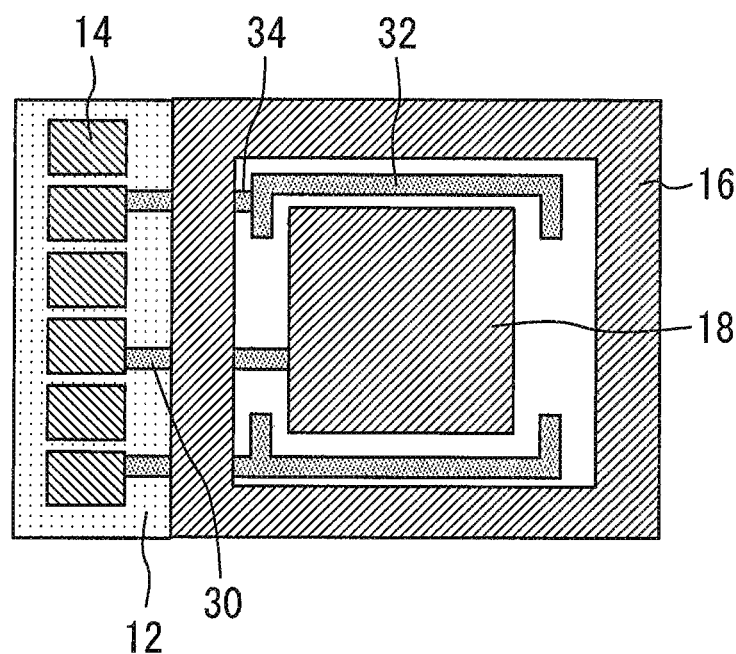
FIG. 2 is a plan view of the semiconductor device.

FIG. 2 is a plan view of the semiconductor device. In FIG. 2, the cap 20 is omitted for convenience of explanation. The junction frame 16 is formed to be annular in planar view. The junction frame 16 is provided so as to surround the movable portion 18. Fixed portions 32, which are surrounded by the junction frame 16, are provided at sides of the movable portion 18. The fixed portions 32 are made of doped polysilicon, as with the movable portion 18. The movable portion 18 and the fixed portions 32 function as a capacitor. To extract acceleration as an electric signal based on a change in the electrostatic capacitance between the movable portion 18 and the fixed portions 32, the movable portion 18 and the electrode 14 are connected with an interconnect 30, and the fixed portions 32 and the electrodes 14 are connected with interconnects 34. The interconnects 30 and 34 are made of, for example, polysilicon or a metal film. The interconnects 30 and 34 are partially located under the junction frame 16.

Referring back to FIG. 1, the recessed portion 20a of the cap 20 is provided so as to face the movable portion 18. Thus, the cap 20 covers a space over the movable portion 18. The inside wall of the cap 20 is provided with irregularities. Specifically, the inside wall of the cap 20 has many bumps and dents and is not planar. A prevention film 22 is formed on such an inside wall of the cap 20. The prevention film 22 is a film formed along the irregularities of the cap 20. Accordingly, the prevention film 22 has irregularities on the surface thereof. The prevention film 22 is a film for preventing gas from emitting from the cap 20 to the space 24 and preventing gas within the space 24 from being absorbed by the cap 20. The prevention film 22 is preferably made of metal. The surface roughness of the inside wall of the cap 20 and the surface roughness of the prevention film 22 are preferably equal.

A semiconductor device manufacturing method according to Embodiment 1 will be described. First, the electrode 14, the junction frame 16, the movable portion 18, the interconnects 30 and 34, and the fixed portions 32 are formed on the semiconductor substrate 1, thus completing the device structure 10. FIG. 2 is a plan view of the completed device structure 10. The step of forming a device structure is referred to as a device structure formation step. The device structure 10 formed by the device structure formation step is not limited to an acceleration sensor. The device structure may be any device in which the movable portion 18 is provided in the enclosed space 24. For example, various kinds of sensors such as an angular velocity sensor, actuators, and the like can be employed as the device structure.

Figure 3:
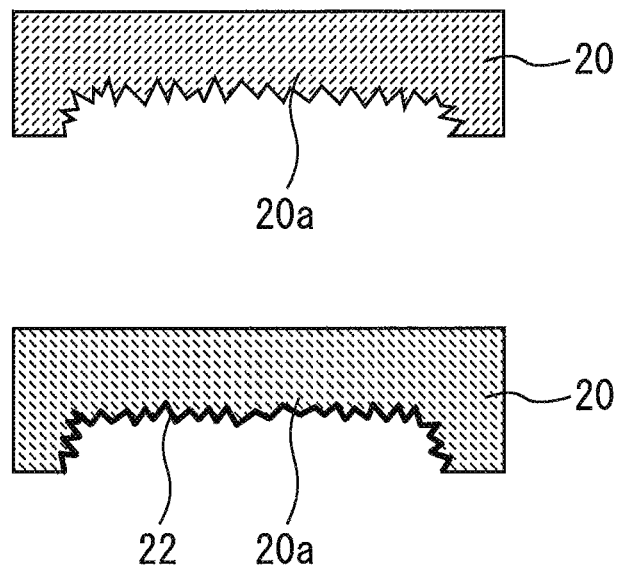
FIG. 3 is a cross-sectional view of the cap.

The cap 20 is formed before or after the device structure formation step. The cap 20 is formed by machining a glass substrate. Specifically, a glass substrate is etched or sandblasted to fabricate the cap 20 having the recessed portion 20a. In the upper part of FIG. 3, the cap 20 having the recessed portion 20a formed by sandblasting is shown. To form irregularities on the inside wall of the cap 20, the recessed portion 20a is preferably formed by sandblasting. The step of forming the cap 20 is referred to as a cap formation step.

Subsequently, the prevention film 22 is formed in the recessed portion 20a of the cap 20. The prevention film 22 is relatively thinly formed so as not to smooth the irregularities of the inside wall of the cap 20. By forming the prevention film 22 along the irregularities of the inside wall of the cap 20, the surface of the prevention film 22 can be provided with irregularities. The step of forming the prevention film 22 is referred to as a prevention film formation step.

After the device structure formation step and the prevention film formation step are finished, an anodic bonding step is performed. In the anodic bonding step, the cap 20 and the junction frame 16 are anodically bonded such that the recessed portion 20a of the cap 20 and the prevention film 22 face the movable portion 18. The cap 20 and the prevention film 22 are kept away from the movable portion 18. One cap may be bonded to one junction frame, or caps may be respectively bonded to a plurality of junction frames formed on a wafer at one time. Anodic bonding is a technique for bonding an insulating material such as glass with a semiconductor such as silicon or a conductor such as metal. In the present embodiment, the cap 20 made of glass and the doped polysilicon of the junction frame 16 are placed on top of each other, and heat and voltage are applied thereto, thus bonding the cap 20 and the junction frame 16 together. Specifically, a voltage of, for example, several hundred volts is applied between the substrate 12 side as an anode and the cap 20 side as a cathode. The heating temperature is preferably around 400° C. The processing time is in the range of several tens of minutes to several hours.

The anodic bonding step is performed in an inert gas atmosphere of argon, nitrogen, or the like, or a vacuum atmosphere. If inert gas is used, the pressure in the space 24 can be controlled by controlling the pressure of the inert gas. An anodic bonding step performed in an inert gas atmosphere under atmospheric pressure causes gas to be absorbed by the cap 20, and has a risk that the pressure in the space 24 cannot be kept at a predetermined pressure. Moreover, an anodic bonding step performed in a vacuum atmosphere causes oxygen to be emitted from the cap 20, and has a risk that the pressure in the space 24 may become higher than the vacuum pressure.

However, in the semiconductor device according to Embodiment 1 of the present invention, since the prevention film 22 is formed on the inside wall of the cap 20, gas can be prevented from being absorbed by the inside wall of the cap 20, and gas can be prevented from being emitted from the cap 20. Accordingly, if the anodic bonding step is performed in an inert gas atmosphere, the space 24 surrounded by the recessed portion 20a and the substrate 12 contains inert gas at a predetermined pressure. Moreover, if the anodic bonding step is performed in a vacuum atmosphere, a vacuum is created in the space 24. Thus, the pressure in the enclosed space 24 can be easily kept at a predetermined pressure by just providing the prevention film 22. This effect can reduce variations in the pressure in the space 24 among products.

If the surface of the prevention film 22 is planar, the movable portion 18 would tend to stick to the prevention film 22. Specifically, the movable portion 18 would be likely to stick to the prevention film due to electrostatic forces during anodic bonding or static electricity or external forces after device fabrication. In other words, the movable portion 18 would be likely to stick to the cap with the prevention film interposed therebetween. Accordingly, in Embodiment 1 of the present invention, the surface of the prevention film 22 is provided with irregularities as shown in the lower part of FIG. 3. This can reduce the contact area when the movable portion 18 comes in contact with the prevention film 22. Accordingly, the movable portion 18 can be prevented from sticking to the inside wall of the cap 20 with the prevention film 22 interposed therebetween.

It is important to make the contact area between the prevention film 22 and the movable portion 18 smaller than the contact area between a prevention film formed to be planar and a movable portion by forming significant irregularities on the surface of the prevention film 22. To reliably prevent the movable portion 18 from sticking, the surface roughness of the prevention film 22 should be large. A sufficient surface roughness can be easily realized by providing irregularities caused by sandblasting on the inside wall of the cap 20 and forming the prevention film 22 along the irregularities. In that case, the surface roughness of the prevention film 22 is preferably equal to the surface roughness of the recessed portion 20a. However, a method for giving the prevention film 22 a sufficient surface roughness is not particularly limited. For example, a prevention film having a roughened surface may be obtained by forming a planar prevention film and then processing the planar prevention film by sandblasting or the like. It should be noted that making the surface of the prevention film "non-planar" is expected to have the effect of preventing to a certain extent the movable portion 18 from sticking.

Performing the anodic bonding step causes the cap 20 and the junction frame 16 to be strongly bonded by covalent bonding. Thus, the semiconductor device with the airtight space 24 can be manufactured. In the semiconductor device according to Embodiment 1 of the present invention, since the prevention film 22 keeps the pressure in the space 24 at a predetermined pressure, there is no need to provide a getter such as an oxygen absorber in the space 24 or adjust the pressure when a bonding voltage is applied. Accordingly, the semiconductor device according to Embodiment 1 is suitable for miniaturization, and can be manufactured by a simple process without complicated pressure adjustment.

The semiconductor device and the semiconductor device manufacturing method according to Embodiment 1 of the present invention can be modified within a range in which features thereof are not lost. For example, the prevention film 22 may be made of a material other than metal. The prevention film is made of a material resistant to the heat of approximately 400° C. to which the prevention film is subjected during anodic bonding. While various modifications have been mentioned in Embodiment 1, these modifications can be applied to semiconductor devices and semiconductor device manufacturing methods according to embodiments below. It should be noted that the semiconductor devices and the semiconductor device manufacturing methods according to the embodiments below have many things in common with those of Embodiment 1, and therefore differences from Embodiment 1 will be mainly described.

Embodiment 2

Figure 4:
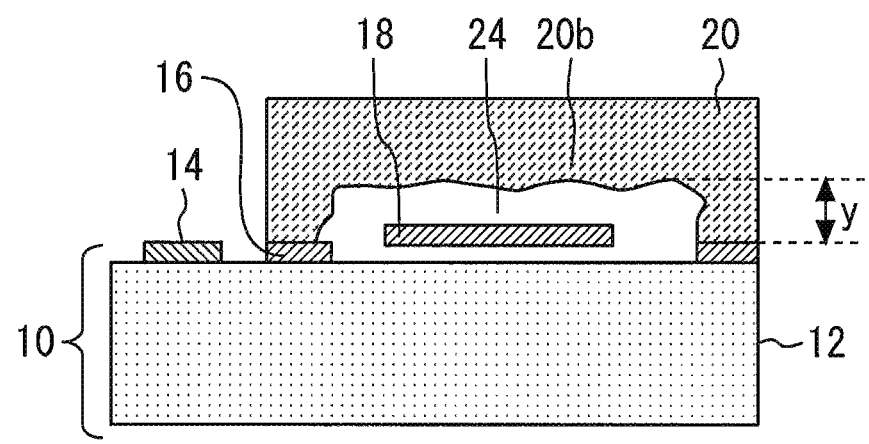
FIG. 4 is a cross-sectional view of a semiconductor device according to Embodiment 2.

FIG. 4 is a cross-sectional view of a semiconductor device according to Embodiment 2. The cap 20 has a recessed portion 20b. The recessed portion 20b is formed by performing wet etching after sandblasting. Accordingly, the inside wall of the recessed portion 20b has higher flatness than the inside wall of the cap 20 in FIG. 1. The hole depth y formed by the recessed portion 20b is, for example, 10 μm or more.

Figure 5:
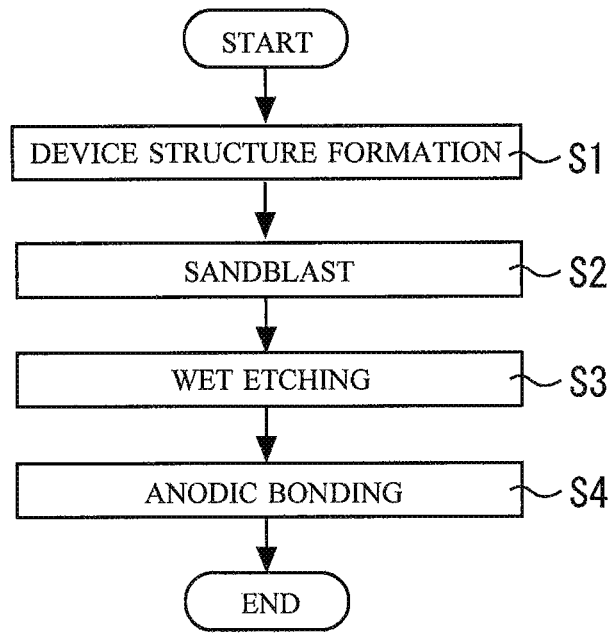
FIG. 5 is a flowchart showing a semiconductor device manufacturing method according to Embodiment 2.

FIG. 5 is a flowchart showing a semiconductor device manufacturing method according to Embodiment 2. First, the same device structure formation step S1 as in Embodiment 1 is performed. Then, a step S2 is performed. In the step S2, a recessed portion is formed in the cap by sandblasting. The hole depth formed by the recessed portion is preferably 10 μM or more. In the case where the hole depth of the recessed portion is desired to be 10 μm or more, forming the recessed portion by sandblasting can be performed in a shorter processing time compared to wet etching, and can obtain high processing accuracy. However, in processing by sandblasting, significant irregularities are formed on the inside wall of the cap, and the surface area of the inside wall of the cap increases.

Subsequently, a step S3 is performed. In the step S3, wet etching is performed on the recessed portion formed by sandblasting to form the recessed portion 20b having a depth of 10 μm or more. For example, wet etching is performed on the recessed portion using a liquid chemical such as hydrogen fluoride (HF). Wet etching using a liquid chemical is not suitable for increasing the hole depth, but can flatten the processed surface and minimize the surface area. Accordingly, the inside wall of the cap 20 after the step S3 is more planar than the inside wall of the cap 20 after the step S2 is finished. The steps S2 and S3 are collectively referred to as a cap formation step. The order of the cap formation step and the device structure formation step may be reversed.

Subsequently, a step S4 is performed. The step S4 is the same as the anodic bonding step described in Embodiment 1. Specifically, the cap 20 and the junction frame 16 are anodically bonded such that the recessed portion 20b faces the movable portion 18. A voltage applied during anodic bonding causes the movable portion 18 to be subjected to electrostatic forces. If the movable portion 18 sticks to and firmly adheres to the cap 20 due to the electrostatic forces, a displacement of the movable portion 18 caused by acceleration cannot be detected. Accordingly, in Embodiment 2 of the present invention, the deep recessed portion 20b having a depth of 10 μm or more is formed to reduce electrostatic forces acting on the movable portion 18.

As described above, the deep recessed portion 20b is formed by sandblasting. Since the inside wall of the cap formed by sandblasting has large irregularities, the surface area thereof increases. As the surface area of the inside wall of the cap increases, the amount of gas emitted or absorbed during the anodic bonding step increases. Accordingly, in Embodiment 2 of the present invention, after a deep recessed portion is formed by sandblasting, wet etching is performed on the recessed portion, thus forming a flat processed surface. This reduces the surface area of the inside wall of the cap 20 and can reduce the emission or absorption of gas during the anodic bonding step.

Embodiment 3

Figure 6:
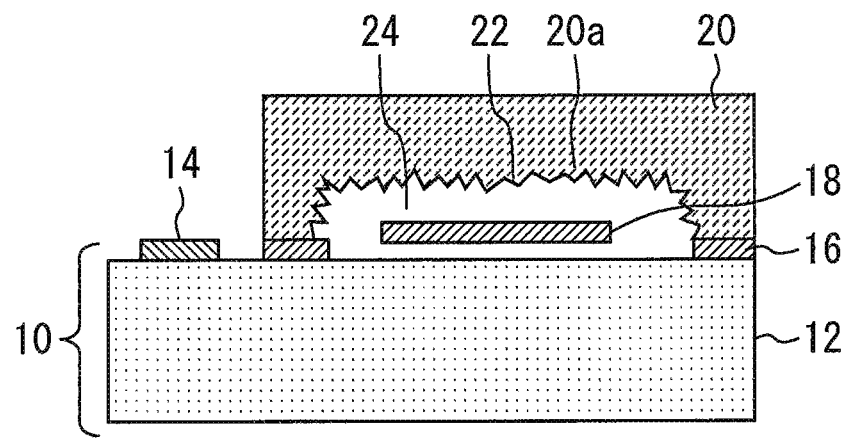
FIG. 6 is a cross-sectional view of a semiconductor device according to Embodiment 3.
Figure 7:
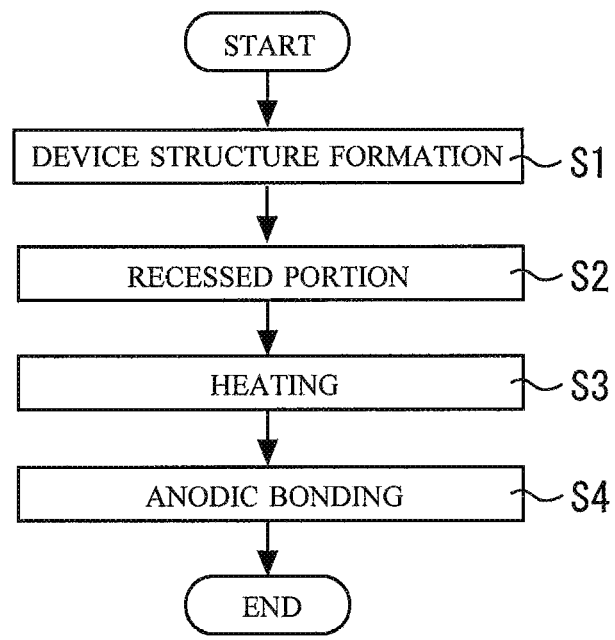
FIG. 7 is a flowchart showing a semiconductor device manufacturing method according to Embodiment 3.

FIG. 6 is a cross-sectional view of a semiconductor device according to Embodiment 3. The recessed portion 20a is exposed in the space 24. FIG. 7 is a flowchart showing a semiconductor device manufacturing method according to Embodiment 3. In Embodiment 3, first, the same device structure formation step S1 as in Embodiment 1 is performed. Then, a step S2 is performed. In the step S2, a cap having the recessed portion 20a is formed. This step is a cap formation step. Unlike Embodiment 2, means for forming the recessed portion 20a in the cap 20 is not particularly limited. The recessed portion 20a is formed by sandblasting or wet etching or combination thereof. In FIG. 6, the recessed portion 20a formed by sandblasting is shown as an example.

Subsequently, a step S3 is performed. In the step S3, the cap 20 is heated. This step is referred to as a heating step. This heating is performed in the same atmosphere and at the same temperature as in the subsequent anodic bonding step. Specifically, if the semiconductor device is heated to 400° C. and inert gas is introduced into the space 24 in the anodic bonding step, the cap is heated to 400° C. in an inert gas atmosphere. If the semiconductor device is heated to 400° C. and the anodic bonding step is performed in a vacuum atmosphere, the cap is heated to 400° C. in a vacuum atmosphere.

Subsequently, a step S4 is performed. The step S4 is the anodic bonding step. In the step S4, the cap 20 and the junction frame 16 are anodically bonded such that the recessed portion 20a faces the movable portion 18, in the same atmosphere and at the same temperature as in the heating step.

If the heating step has been performed in an inert gas atmosphere, the glass on and near the surface of the cap 20 is filled with inert gas in a saturated condition. Accordingly, gas is not absorbed by the cap 20 in the anodic bonding step performed at the same temperature as in the heating step. Thus, the anodic bonding step does not require pressure control taking into account gas absorption, and complicated pressure adjustment can be avoided.

If the heating step has been performed in a vacuum atmosphere, the glass on and near the surface of the cap 20 does not contain gas. Accordingly, gas is not emitted from the cap 20 in the anodic bonding step performed at the same temperature as in the heating step. Thus, the anodic bonding step does not require pressure control taking into account gas emission, and complicated pressure adjustment can be avoided.

It should be noted that features of the semiconductor devices and the semiconductor device manufacturing methods according to the embodiments described above may be used in combination.

In accordance with the present invention, a prevention film covering an inside wall of a cap is provided with irregularities. Accordingly, the pressure in an enclosed space for housing a movable portion can be kept at a predetermined pressure, and the movable portion can be prevented from sticking to the inside wall of the cap.

Many modifications and variations of the present invention are possible in the light of the above teachings. It is therefore to be understood that within the scope of the appended claims variations may be practiced otherwise than as specifically described.

What is claimed is:

1. A semiconductor device comprising:
    a substrate;
    an electrode provided on the substrate;
    a movable portion provided on the substrate;
    fixed portions arranged on an outer periphery of the movable portion when seen in plan view, the fixed portions and the movable portion forming a capacitor;
    a junction frame provided on the substrate to surround the movable portion;
    a cap bonded to the junction frame, the cap having a recessed portion and covering a space over the movable portion with the recessed portion facing the movable portion, the cap having an inside wall provided with a plurality of irregularly spaced bumps and dents; and
    a prevention film formed on the inside wall of the cap, the prevention film having a plurality of irregularly spaced bumps and dents,
    wherein the electrode is arranged outside an outer periphery of the junction frame, and
    the prevention film is configured to prevent gas from being absorbed by and from being emitted from the cap.

2. The semiconductor device according to claim 1, wherein a surface roughness of the inside wall and a surface roughness of the prevention film are equal.

3. The semiconductor device according to claim 1, wherein the cap and the junction frame are bonded by covalent bonding.

4. The semiconductor device according to claim 1, wherein the prevention film is made of metal.

5. The semiconductor device according to claim 1, wherein a space surrounded by the recessed portion and the substrate contains inert gas.

6. The semiconductor device according to claim 1, wherein a space surrounded by the recessed portion and the substrate is a vacuum.

7. The semiconductor device according to claim 1, wherein the recessed portion is formed by sandblasting.

8. The semiconductor device according to claim 1, wherein the junction frame surrounds the fixed portions.

* * * * *